United States Patent
Tellis

(10) Patent No.: US 10,586,358 B1
(45) Date of Patent: Mar. 10, 2020

(54) SYSTEM AND METHOD FOR VISUALIZATION OF BEACON CLUSTERS ON THE WEB

(71) Applicant: Akamai Technologies, Inc., Cambridge, MA (US)

(72) Inventor: Philip S. Tellis, Cambridge, MA (US)

(73) Assignee: Akamai Technologies, Inc., Cambridge, MA (US)

( * ) Notice: Subject to any disclaimer, the term of this patent is extended or adjusted under 35 U.S.C. 154(b) by 0 days.

(21) Appl. No.: 15/591,353

(22) Filed: May 10, 2017

(51) Int. Cl.
| | |
|---|---|
| G06F 17/50 | (2006.01) |
| G06T 11/20 | (2006.01) |
| H04L 12/24 | (2006.01) |
| H04L 29/08 | (2006.01) |

(52) U.S. Cl.
CPC ........ *G06T 11/206* (2013.01); *G06F 17/5009* (2013.01); *H04L 41/145* (2013.01); *H04L 41/22* (2013.01); *H04L 67/10* (2013.01)

(58) Field of Classification Search
None
See application file for complete search history.

(56) References Cited

U.S. PATENT DOCUMENTS

| | | | |
|---|---|---|---|
| 6,738,933 B2 | 5/2004 | Fraenkel et al. | |
| 7,050,056 B2 | 5/2006 | Meyringer | |
| 7,743,128 B2 | 6/2010 | Mullarkey | |
| 8,060,581 B2 | 11/2011 | Day et al. | |
| 8,479,122 B2 | 7/2013 | Hotelling et al. | |
| 8,510,600 B2 | 8/2013 | Gardner et al. | |
| 9,015,348 B2 | 4/2015 | Hofmann et al. | |
| 9,021,362 B2 | 4/2015 | Tellis et al. | |
| 9,026,661 B2 | 5/2015 | Swildens et al. | |
| 9,154,611 B1 | 10/2015 | Jackson et al. | |
| 9,251,035 B1 | 2/2016 | Vazac et al. | |
| 9,384,121 B2 | 7/2016 | Jackson et al. | |
| 9,436,579 B2 | 9/2016 | Hemmert et al. | |
| 9,450,834 B2 | 9/2016 | Gardner et al. | |
| 9,491,248 B2 | 11/2016 | Broda et al. | |
| 9,495,473 B2 | 11/2016 | Gardner et al. | |
| 9,720,569 B2 | 8/2017 | Gardner et al. | |
| 9,740,368 B1 * | 8/2017 | Love | G06F 3/04817 |

(Continued)

OTHER PUBLICATIONS

U.S. Appl. No. 14/668,928, filed Mar. 25, 2015.

(Continued)

*Primary Examiner* — Jeffrey J Chow

(57) ABSTRACT

A computer-implemented method for creating a visualization of beacons collected over a specified time period from users on a website. Beacons are rendered as nodes grouped into clusters, with relatedness between beacons being represented as a link. The number of nodes rendered is reduced along with the number of links that connect pairs of nodes. The resulting data structure is rendered as a force-directed chart by assigning force unit values to each of the nodes and links, each representative node of a cluster of nodes being assigned a relatively high negative charge and all remaining nodes in the cluster being assigned a relatively low negative charge. Link distances and strengths between unrelated/related clusters are also assigned values. A set of physical laws is applied to all of the nodes and links to determine their relative position in the visualization based on their assigned force unit values.

24 Claims, 18 Drawing Sheets

(56) References Cited

U.S. PATENT DOCUMENTS

| | | | |
|---|---|---|---|
| 9,836,183 B1 * | 12/2017 | Love | G06F 3/04817 |
| 9,882,793 B2 | 1/2018 | Broda et al. | |
| 9,911,211 B1 * | 3/2018 | Damaraju | G06T 11/206 |
| 9,923,782 B1 * | 3/2018 | Bindle | H04L 41/22 |
| 9,942,105 B2 | 4/2018 | Gardner et al. | |
| D820,297 S | 6/2018 | Gardner et al. | |
| 9,990,110 B1 | 6/2018 | Lounibos et al. | |
| 10,037,393 B1 | 7/2018 | Polovick et al. | |
| 10,067,850 B2 | 9/2018 | Vazac et al. | |
| D832,283 S | 10/2018 | Tellis et al. | |
| 10,114,915 B2 | 10/2018 | Polovick et al. | |
| 10,177,999 B2 | 1/2019 | Broda et al. | |
| 10,346,431 B1 | 7/2019 | Broda et al. | |
| 2002/0147937 A1 | 10/2002 | Wolf | |
| 2003/0074161 A1 | 4/2003 | Smocha et al. | |
| 2003/0109951 A1 | 6/2003 | Hsiung et al. | |
| 2004/0039550 A1 | 2/2004 | Myers | |
| 2004/0059544 A1 | 3/2004 | Smocha et al. | |
| 2004/0123320 A1 | 6/2004 | Daily et al. | |
| 2005/0216234 A1 | 9/2005 | Glas et al. | |
| 2006/0229931 A1 | 10/2006 | Fligler et al. | |
| 2007/0288205 A1 | 12/2007 | Vazquez et al. | |
| 2008/0066009 A1 | 3/2008 | Gardner et al. | |
| 2008/0140347 A1 | 6/2008 | Ramsey et al. | |
| 2008/0189408 A1 | 8/2008 | Cancel et al. | |
| 2010/0023867 A1 | 1/2010 | Coldiron et al. | |
| 2010/0088273 A1 * | 4/2010 | Donaldson | G06Q 10/10 707/609 |
| 2010/0262576 A1 * | 10/2010 | Stockwell | G06F 17/2785 706/55 |
| 2010/0274818 A1 * | 10/2010 | Chauvin | G06F 16/9024 707/803 |
| 2011/0066892 A1 | 3/2011 | Gardner et al. | |
| 2011/0202517 A1 | 8/2011 | Reddy et al. | |
| 2011/0283205 A1 * | 11/2011 | Nie | G06F 16/9535 715/763 |
| 2012/0017165 A1 | 1/2012 | Gardner et al. | |
| 2012/0023429 A1 | 1/2012 | Medhi | |
| 2012/0166634 A1 | 6/2012 | Baumback et al. | |
| 2012/0246310 A1 | 9/2012 | Broda et al. | |
| 2013/0030851 A1 * | 1/2013 | Rahmouni | G06Q 10/00 705/7.11 |
| 2013/0097307 A1 | 4/2013 | Vazac et al. | |
| 2013/0116976 A1 | 5/2013 | Kanemasa et al. | |
| 2013/0166634 A1 | 6/2013 | Holland | |
| 2014/0033055 A1 | 1/2014 | Gardner et al. | |
| 2014/0089287 A1 * | 3/2014 | Connolly | G06F 17/30991 707/707 |
| 2014/0189320 A1 | 7/2014 | Kuo | |
| 2014/0280880 A1 | 9/2014 | Tellis et al. | |
| 2014/0297690 A1 * | 10/2014 | Osoekawa | G06F 17/30958 707/798 |
| 2015/0067527 A1 | 3/2015 | Gardner et al. | |
| 2015/0154787 A1 * | 6/2015 | Morikawa | G06T 11/206 345/424 |
| 2015/0222494 A1 | 8/2015 | Broda et al. | |
| 2015/0319071 A1 | 11/2015 | Kaasila et al. | |
| 2017/0103556 A1 * | 4/2017 | Glover | G06T 11/206 |
| 2018/0011774 A1 | 1/2018 | Vazac et al. | |
| 2018/0137155 A1 * | 5/2018 | Majumdar | G06N 10/00 |
| 2018/0165400 A1 * | 6/2018 | Feld | G06F 17/5054 |
| 2018/0246626 A1 | 8/2018 | Lounibos et al. | |

OTHER PUBLICATIONS

U.S. Appl. No. 15/066,969, filed Mar. 10, 2016.
U.S. Appl. No. 15/155,185, filed May 16, 2016.
U.S. Appl. No. 15/441,718, filed Feb. 24, 2017.
U.S. Appl. No. 15/448,954, filed Mar. 3, 2017.
U.S. Appl. No. 15/449,061, filed Mar. 3, 2017.
U.S. Appl. No. 15/591,353, filed May 10, 2017.
U.S. Appl. No. 15/668,002, filed Aug. 3, 2017.
U.S. Appl. No. 15/862,503, filed Jan. 4, 2018.

* cited by examiner

PLP on iOS 69 beacons @ 4.8s
472ms → 1.7s ↦ [3.5s → 4.8s → 7.8s] → 12.7s → 38.2s 2-98pc: 36
iqr: 30

41 cities
36 ISPs/Orgs
31 regions
14 countries
 5 load time buckets
 5 network speeds
 2 browsers
 2 device types

FIG. 12

3599. PDP 3.7s 69633 bytes, 629 nodes, 25 scripts, 11 images

⊞ Aarhus, 18 8210, Denmark

Dialup via Bolignet-Aarhus

Firefox/34 on Windows/8.1

FIG. 13

SYSTEM AND METHOD FOR VISUALIZATION OF BEACON CLUSTERS ON THE WEB

TECHNICAL FIELD

The present disclosure relates generally to the field of cloud computing; more particularly, to automated systems and methods for visualizing the interaction between a large number of performance datapoints on a website.

BACKGROUND

For years, enterprises and developers have sought an easy and affordable way to use cloud computing as a way to load and performance test their web-based applications. Business enterprises are also interested in real user measurement (RUM) data analysis that captures and collects data about present, real user experiences when actual users visit and navigate through a website or web application. Traditional analytical tools have been able to provide data analysis solutions that collect data about past events, it has been more problematic to deliver real-time business intelligence information based on actual mobile and desktop user experience as it occurs.

Technical professionals and business managers need a comprehensive solution to test, monitor and measure real user behavior to ensure customers get the most out of their app or site—whether it's mobile, on the web, or both. For an e-Commerce business or website owner, capturing and properly analyzing RUM information from a website has been a daunting task. In recent years, developers have attempted to solve this problem by creating software and analytic tools that can monitor real user experiences on websites in real-time. By way of example, U.S. Pat. No. 9,450,834 teaches a cloud-based RUM system and method for websites and web applications that provides a user with a graphical view that shows real-time performance information obtained from RUM data.

One of the difficulties with such systems is collecting and presenting efficient visualizations of RUM data obtained from the Web. Due to the very large volume of data collected, often involving tens of millions or even billions of user measurements, visualizing the interactions between such a large numbers of datapoints on a website can quickly exceed limits on memory, network capacity, CPU resources, and available pixels of display screens. Rendering such large numbers of RUM data beacons or nodes is extremely memory intensive. In addition, calculating the interactions between nodes within and across different beacon clusters is typically an $O(n^2)$ algorithm, which slows down CPU performance with the square of the number of nodes (n). Bandwidth constraints arise as the amount of data that needs to be transferred over the network to the client increases. Furthermore, even on a large display monitor having a resolution of 2560×1440 pixels, approximately 400,000 data points all spread out would completely cover the screen, making it virtually impossible for the user to notice any patterns.

BRIEF DESCRIPTION OF THE DRAWINGS

The present disclosure will be understood more fully from the detailed description that follows and from the accompanying drawings, which however, should not be taken to limit the invention to the specific embodiments shown, but are for explanation and understanding only.

FIG. 12 is an example graphical user interface window that shows cluster details, including a cluster description.

FIG. 13 is an example graphical user interface window that shows beacon details including the page construction, geo location, ISP and browser details.

DETAILED DESCRIPTION

Figure 1:
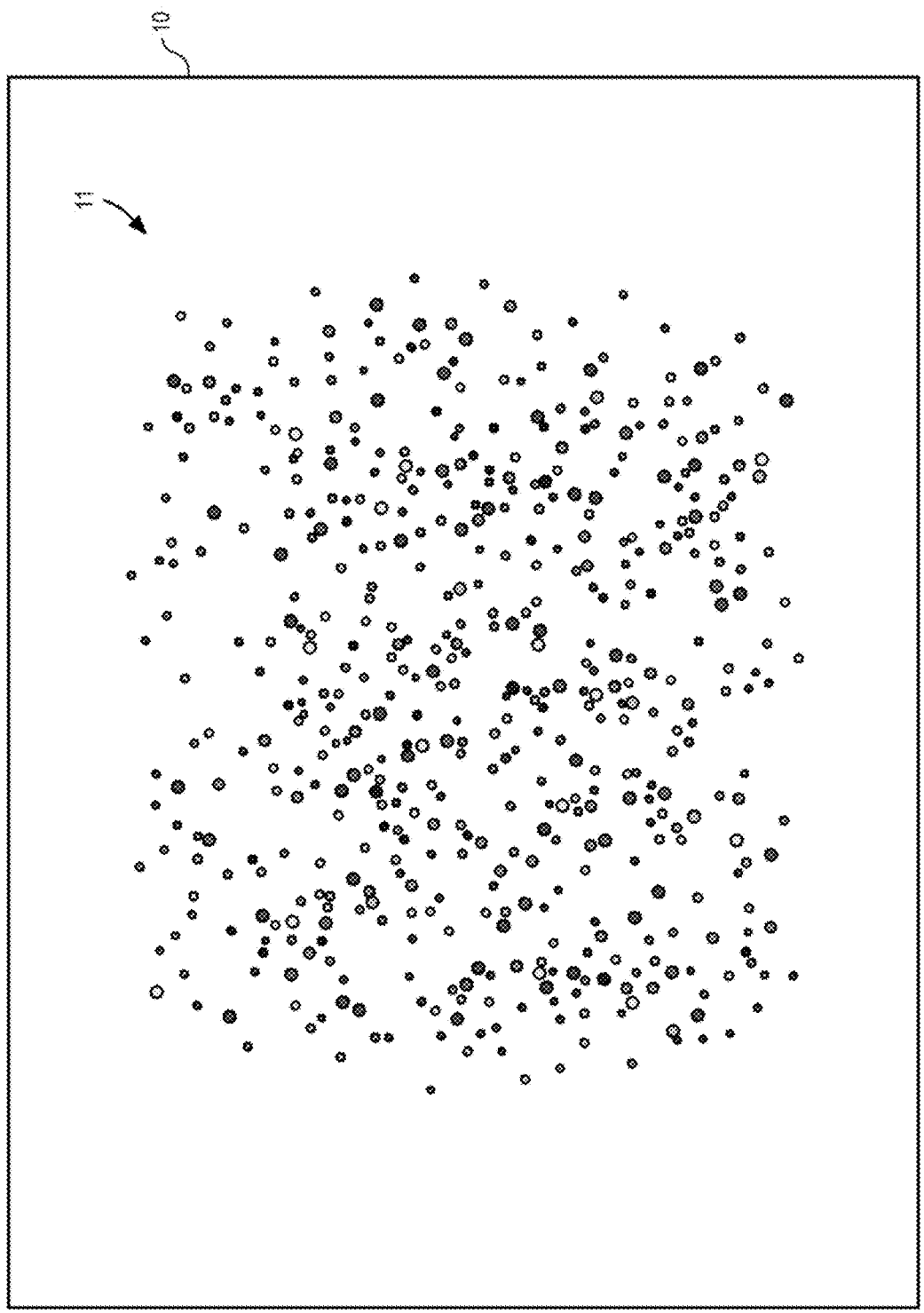
FIG. 1 is a first visualization in an example sequence of visualizations that show how beacons and clusters of beacons animate into a stable position.

In the following description specific details are set forth, such as data analysis platforms, method steps, algorithms, metrics, statistics, formulas, etc., in order to provide a thorough understanding of the subject matter disclosed herein. However, persons having ordinary skill in the relevant arts will appreciate that these specific details may not be needed to practice the present invention. It should also be understood that the elements in the FIGS. are representational, and are not drawn to scale in the interest of clarity.

References throughout this description to "one embodiment", "an embodiment", "one example" or "an example" means that a particular feature, structure or characteristic described in connection with the embodiment or example is included in at least one embodiment. The phrases "in one embodiment", "in an embodiment", "one example" or "an example" in various places throughout this description are not necessarily all referring to the same embodiment or example. Furthermore, the particular features, structures or characteristics may be combined in any suitable combinations and/or sub-combinations in one or more embodiments or examples.

In the context of the present application, the term "cloud" broadly refers to a collection of machine instances, storage and/or network devices that work together in concert. The term "cloud computing" refers to a paradigm in which machine, storage, and application resources exist on a "cloud" of servers. In cloud computing shared resources, software and information are provided on-demand, like a public utility, via the Internet. Thus, cloud computing provides computation, data access, and storage resources without requiring users to know the location and other physical details of the computing infrastructure.

The term "server" broadly refers to any combination of hardware or software embodied in a computer designed to provide services to client devices or processes. A server therefore can refer to a computer that runs a server operating system from computer-executable code stored in a memory, and which is provided to the user as a virtualized or non-virtualized machine; it can also refer to any software or dedicated hardware capable of providing computing services. A web server is an information technology that processes requests via HTTP, the basic protocol used to distribute information on the World Wide Web. A webpage is a web document that is suitable for the World Wide Web. A web browser running on a client or user computing device displays a web page on a monitor or mobile device screen.

In the context of the present disclosure, a "mobile computing device" or "mobile device" (for short) refers to any one of a number of different portable electronic devices having a touch-sensitive display with a graphical user interface (GUI), one or more processors, memory and one or more modules, programs or sets of instructions for performing methods associated with the operations described herein. A mobile computing device typically runs on an operating system executed on one or more processors, and may also run one or more applications installed or resident in memory (e.g., firmware, RAM, EEPROM, etc.) In some embodiments, the mobile computing device may provide a plurality of functions including wireless communication, thereby allowing a user of the mobile device access data and information via connection to the Internet. Mobile computing devices include smartphones, tablet computers, wearable computers, ultra-mobile PCs, personal digital assistants, other hand-held devices, as well as other mobile computers (e.g., carputers) that have touch screen interfaces with wireless capabilities.

A "load time" of a webpage is defined as the time (usually in milliseconds or seconds) from the start of the page navigation to the Page Onload event, i.e., when the webpage is considered ready.

The term "real-time" refers to a level of computer responsiveness that a user senses as sufficiently immediate or that enables the computer to keep up with some external process (for example, to present visualizations of aggregated user session paths that constantly change responsive to new beacon data). Thus, real-time is a mode of computer operation in which the computer collects data, analyzes or computes with the data, reports (e.g., visually displays) and/or stores the results nearly simultaneously, i.e., within milliseconds or a few seconds (e.g., 1-10 seconds) of measurements being beaconed, or uploaded from a database, to a server.

A "mouseover" or "mouse hover" is computer function in which one or more images or hyperlinks may be generated or activated when a user moves or "hovers" the cursor or pointer over at least one of a node, cluster or link appearing in a web browser window, usually with a mouse, but also possible using a digital pen or touch command.

In the context of the present disclosure, the term "beacon" refers to data related to a user's experience on a particular website or web application collected by a library running on the browser of a client device, and sent to a server (e.g., a collector server) via Hypertext Transfer (or Transport) Protocol (HTTP), or some other protocol. In the case of a mobile app, the data gathered may be based on definitions contained in a configuration file that is periodically downloaded to the mobile device running the mobile app. For example, every user who runs a particular mobile app on their mobile device may also automatically download a configuration file every few minutes that defines the various metrics and/or timers to be gathered and beaconed back to a server from the user's mobile device in real-time as the user runs or uses the mobile app. In the case of a website, the library may, in one embodiment, be a JavaScript library running on the browser of a client device.

A graphical representation of a beacon is also referred to as a "node". A graphical representation of a group of closely-related beacons is commonly referred to as a "cluster" or "cell". The relatedness of a given dimension as between a pair of beacons is depicted graphically by a line, also known as an "edge" or "link", connecting the two beacons or nodes.

The server receiving the beacon information may aggregate that data along with similar data received from other users accessing the same website, web application, or mobile application. Any HTTP headers sent by the browser as part of the HTTP protocol may also be considered part of the beacon. A beacon may therefore be thought of as a page view on a website or application, but without a corresponding page. For every user who visits that website, the browser running the library on the user's client device measures various metrics (e.g., webpage load time) and records data that is then sent or "beaconed" back to a results server in real-time as the user navigates through or uses the website or application.

An "mPulse™ domain" refers to a web domain of a client or customer of a data analysis platform or program that provides an analytic dashboard window with visual information from real user measurement (RUM) data captured, collected and aggregated by a server-based system. The RUM data is typically beaconed from a user's mobile device, or other computing device, to a results server that collects and aggregates the data. The results server, or another server, may also perform statistical analysis on the RUM data, e.g., calculate an average or median load time.

In the context of the present disclosure, a "page group" refers to a logical collection of related webpages from a website. Page groups are defined by the website stakeholders, business analysts, operations engineers, or anyone else who may be an mPulse end user. For example, a typical partition of an online retailer's website might have the homepage(s) put into a page group called "Homepage", the product pages of a group called "Product Page", the search result pages in a group called "Search Results", etc.

A "message" generally refers to a unit of data that can be sent via an electronics communications network, e.g., the Internet, to another computational or communications system or device, e.g., to a server. By way of example, a message could represent a communication sent to a queuing system, a REST call, or a Hypertext Transfer Protocol (HTTP) request. A message could also be instantiated entirely or partially as a single operation, such as a web service call in any one of a variety of forms, e.g., XML, JMS, HTML, JSON, etc. A "message clip" (or "clip" for short) comprises a set of one or more messages that includes a specification of the location, timing and/or dependencies of objects or elements specified within that set of messages. A clip typically comprises a plurality (e.g., hundreds or thousands) of sequenced messages that form part of a larger load test composition.

In one embodiment, a system, method, and computer program product for efficiently visualizing commonalities among large numbers of different types of beacons is provided. The commonalities may be expressed in terms of a variety of different dimensions, which could include geographic location, browser, operating system (OS) of the user's client device, webpage performance, size (bytes), network, JavaScripts, or anything else that can be described about a webpage or client device. The visualization provides a quick way to determine patterns among clusters of beacons or nodes for a website or web application. The visualization allows a viewer to easily identify patterns that could lead to performance issues that would not be apparent or visible to a person just looking at the beacon data itself.

In one embodiment, an animated visualization is generated by execution of a computer-implemented algorithm on an entire dataset of beacons collected and stored in a database over a given time period (e.g., weeks, months, etc.). Execution of the algorithm creates an animated visualization that accurately and proportionately represents all beacons across the entire dataset, but with a markedly reduced number of nodes and links, thereby reducing memory usage, network utilization (bandwidth), and CPU usage.

In one embodiment, performance gains are achieved through an algorithm that reduces the number of nodes rendered on the display screen. Further improvement is achieved utilizing another algorithm that reduces the number of links between nodes, which reduces the number of nodes that interact with each other. The resulting data structure is rendered in a sequence of visualizations as a force-directed chart that moves all beacons/nodes into relative position on a display screen.

In one embodiment, a convex hull is drawn around all points in a cluster of beacons, which makes the visualization clearer and more easily comprehensible. In another embodiment, labels are rendered using a separate force-directed graph. In one embodiment, the beacons or nodes are rendered as circles, with the radius of the circle being based on the complexity of the beacon, which may include byte size, node count, script count and image count. In a specific embodiment, the circles are colored-coded based on beacon performance (e.g., webpage load time).

FIGS. 1-6 are an example sequence of visualizations, each of which is rendered on a display screen, which shows how beacons and clusters of beacons animate into a stable position over time (e.g., 20 seconds). The visualizations in the sequence represent a data structure that is iteratively rendered as a force-directed chart where forces are set or assigned for each node and each link between nodes. In one embodiment, the nodes are modeled or treated as physical objects, both attracted to a large gravitational force (e.g., mass) at the center of the visualization and repulsed from each other (e.g., similarly-charged objects), and where the relatedness between pairs of beacons (and clusters) is expressed by an elasticity force.

The sequence illustrated in FIGS. 1-6, shows how clusters animate into position. Starting from a single cloud of beacons, the beacons move closer together or further away depending on how closely they are related to each other. As clusters start to form, larger clusters are eventually encapsulated in a convex hull that delineates them from nearby clusters. In one embodiment, as these clusters get progressively more defined, labels may start to appear in the visualization. These labels are linked to the clusters. (Note: labels are not depicted in FIGS. 1-6 to avoid obscuring the illustrations. Labels do appear in FIGS. 7-10, which are expanded views of various clusters taken from portions of FIG. 6.) Finally, related clusters are linked together to form localized super-clusters Note that although the example animated sequence is shown in six frames/drawings, in actual implementation the number of iterations where the display screen changes may be consist of a greater or fewer number of screen changes. In one implementation, the movement and positioning of the nodes, clusters, and links may appear to change continuously until the visualization achieves a stable equilibrium. In one embodiment, the animated sequence is generated from historical data. In another embodiment, the animated sequence is generated in real-time, based on real-time mPulse beacon data. In yet another embodiment, the animated sequence is initially generated from historical data (e.g., the past 30 days) and then is augmented with real-time mPulse beacon data, so that the visualization may continue to change over time.

FIG. 1 is a first visualization in an example sequence of visualizations that show how beacons and clusters of beacons animate into a stable position. The example of FIG. 1 shows a user interface window 10 that includes a plurality of nodes 11 largely scattered or distributed over an area of client side display screen. Nodes 11 have different sizes and shadings. In one embodiment, each node is color coded in one color selected from colors ranging from dark green (representing a very fast median load time of a webpage), light green, yellow, orange, light-red, to dark red (representing a slow median load time). By way of example, there may be 17-20 distinct colors across a range of load times ranging from a few milliseconds to 10 or more seconds. In one embodiment, the size of each node corresponds to a webpage size (in bytes).

It is appreciated that the computer program executing the algorithm on a server that generates the visualization has access to the entire dataset of beacons over a given time period, but the number of nodes 11 sent from the server to the client, and which are actually rendered in window 10 is greatly reduced. That is, to reduce clutter and improve the efficiency of the animation, only a representative subset of all available beacons is rendered. This rendering approach takes advantage of the fact that the human eye cannot easily discern between two very large numbers (e.g., 40,000 versus 400,000) of small objects even if they differ by orders of magnitude. The algorithm for reducing the number of nodes sent from the server to the client device is discussed below in connection with FIG. 18.

It should also be understood that the initial visualization shown in FIG. 1 may be rendered before setting up the forces for each node and edge. Alternatively, the initial sequence in the visualization may be rendered after setting up the forces and an initial iteration wherein a set of physical laws are applied to the nodes and links. Note that none of the links are shown in FIGS. 1-5 to avoid overly complicating the visualizations. In one embodiment, rendering of the links or edges occurs at or near the end of the animated sequence when the positions of the nodes and clusters are relatively stable.

It is further appreciated that the distribution of nodes 11 shown in FIG. 1 actually represents a complex data structure produced by applying node reduction and link reduction algorithms to the entire dataset of beacons collected and stored in memory (e.g., disk) over a predetermined time period. What is rendered and sent to the customer's browser is a representative subset of nodes and links. The nodes represent beacons and the links show the relatedness of the beacons for a given dimension. For example, beacons may be related based on geography (e.g., all U.S. beacons), operating system (e.g., Android, iOS etc.), browser (e.g., Chrome), and so on.

Beacons are clustered into groups or cells based on their relatedness. For instance, one cluster may consist of beacons collected from client devices running iOS on Mobile Safari. Another cluster may consist of beacons from Android OS on Chrome Mobile, etc. In one embodiment, methods such as K-Means, K-Medoids, and Density-Based Spatial Clustering of Applications with Noise (DBSCAN) may be used to turn a large number of web performance beacons into a plurality of clusters. The clusters for the client side visualization may be created by a server side process using any suitable clustering method.

In one embodiment, for each cluster, a single representative node is identified and marked as immutable. For example, if a group or cluster consists of Chrome users on Windows OS from California, the representative node may be selected as the node having a webpage load time that is closest to the average or median load time for that group. Alternatively, the representative node may be selected as one that is closest to the median DOM size, or some other dimension.

Figure 2:
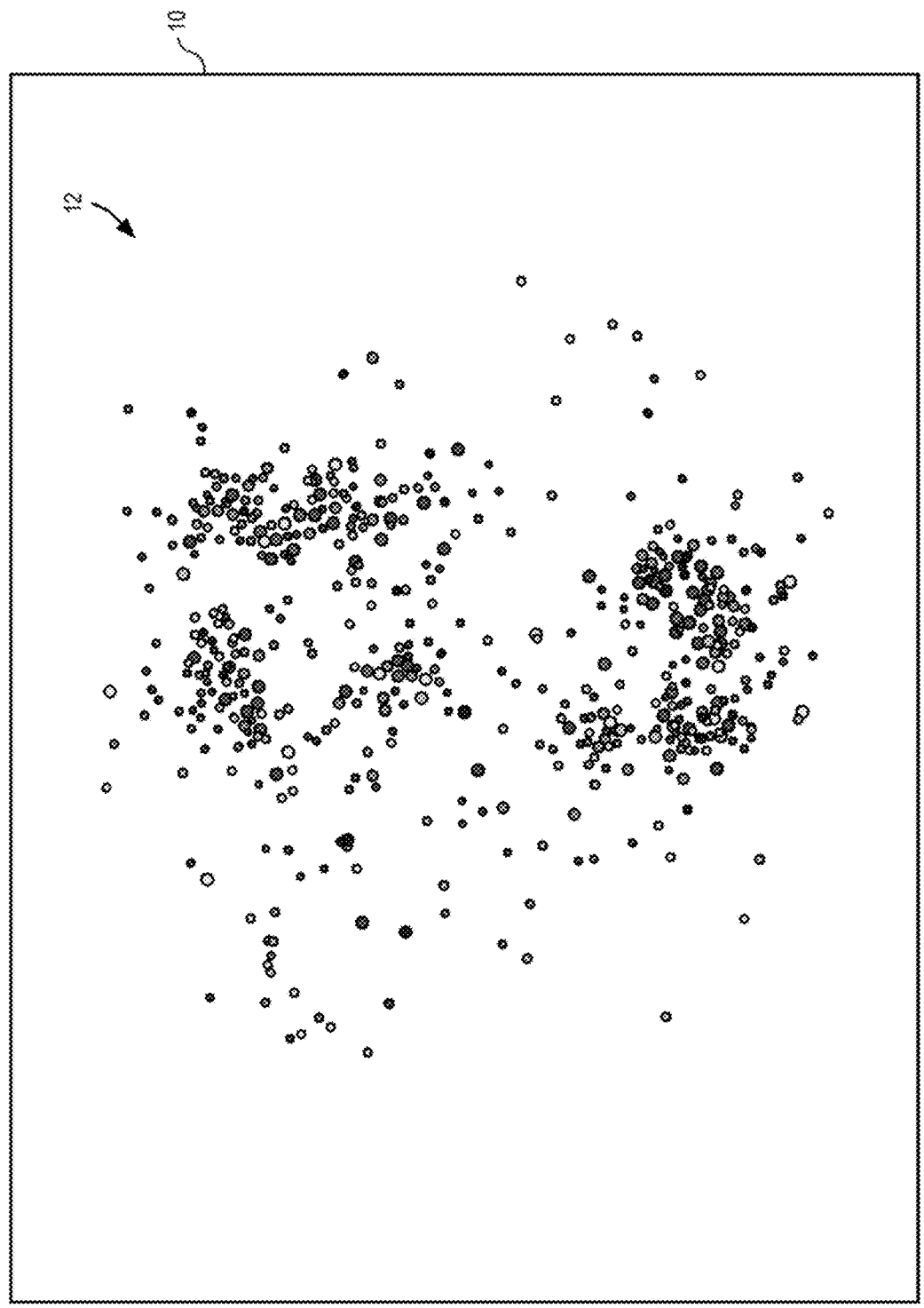
FIG. 2 is a second visualization in an example sequence of visualizations that show how beacons and clusters of beacons animate into a stable position.

FIG. 2 is a second visualization in an example sequence of visualizations that show how beacons and clusters of beacons animate into a stable position. In this example, window 10 shows a distribution of nodes 12 created by movement of the nodes 11 of FIG. 1 to the new positions shown in FIG. 2. The distribution of nodes 12 is produced by rendering, as a force-directed chart, the data structure created behind FIG. 1. In one embodiment, this involves first setting up or assigning the forces for each node and edge, as follows:

All cluster representative nodes are each assigned a high negative charge of −850 units. All nodes within a given cluster are each assigned a negative charge between −10 to −40 units, based on their relative complexity. The link distance between unrelated clusters is set to 800 units. The link distance between related clusters is set to 1 unit. The link strength for related beacons is set to 1 unit. The link strength for unrelated beacons is set to 0.2 units. The center of the visualization (i.e., the center of the browser window) is assigned an elastic force that simulates a gravitational attraction between all of the nodes and a center of the visualization. This attractive force works in a similar fashion to having an invisible spring between each beacon or node and the center of the visualization. The purpose of this simulated gravitational attraction is to prevent nodes from "escaping" from the visualization or display screen. It is appreciated that in other embodiments different force and charge units may be assigned to the nodes and links.

In a specific embodiment, three different laws of physics are then applied to all nodes sent to the client to determine their relative position on the display screen of the client device. These laws include: (1) Newton's law of gravitational attraction that pulls all nodes towards the center, e.g., https://en.wikipedia.org/wiki/Newton's_law_of_universal_gravitation; (2) Coulomb's inverse-square law for the forces that push apart similarly charged particles, e.g., https://en.wikipedia.org/wiki/Coulomb's_law; and (3) Hooke's law of elasticity for the force required to pull apart particles linked by an elastic band, e.g., https://en.wikipedia.org/wiki/Hook's_law.

Persons of skill in the art will understand that application of these laws and forces allows unrelated clusters to pull apart from each other, while related clusters stay relatively close together, and related beacons within a given cluster stay even closer. Given the complexity of calculating the above forces between large numbers of nodes, the process may be performed iteratively over the interactions. In one embodiment, the iterations are performed using Verlet Integration until the forces reach a stable state. A variety of methods may be utilized for calculating the forces, e.g., http://users.monash.edu/~tdwyer/Dwyer2009FastConstraints.pdf, which provides a scalable technique for graph layout, and http://www.gamasutra.com/resource_guide/20030121/jacobson_pfv.htm, which provides an approach to physically-based modeling that is well-suited for interactive use. In a specific embodiment, the interactions between distant clusters is reduced using a Barnes-Hut simulation which treats all distant points in a certain direction as being a single cumulative point. This has the effect of reducing the algorithmic complexity from $O(n^2)$ to an $O(n \log n)$.

Figure 3:
FIG. 3 is a third visualization in an example sequence of visualizations that show how beacons and clusters of beacons animate into a stable position.

FIG. 3 is a third visualization in an example sequence of visualizations that show how beacons and clusters of beacons animate into a stable position. In this example, the distribution of nodes 12 from FIG. 2 has been subjected to a further iteration of the forces and physical laws such that the nodes have moved to new positions where they are now seen to form distinct groups or clusters 13, 14, and 15. As shown, many of the beacons or nodes that are related to each other have moved closer together within each of the clusters 13, 14, and 15. At the same time, clusters 13, 14, and 15 have moved further away from each other due to the fact that they are not closely related.

Figure 4:
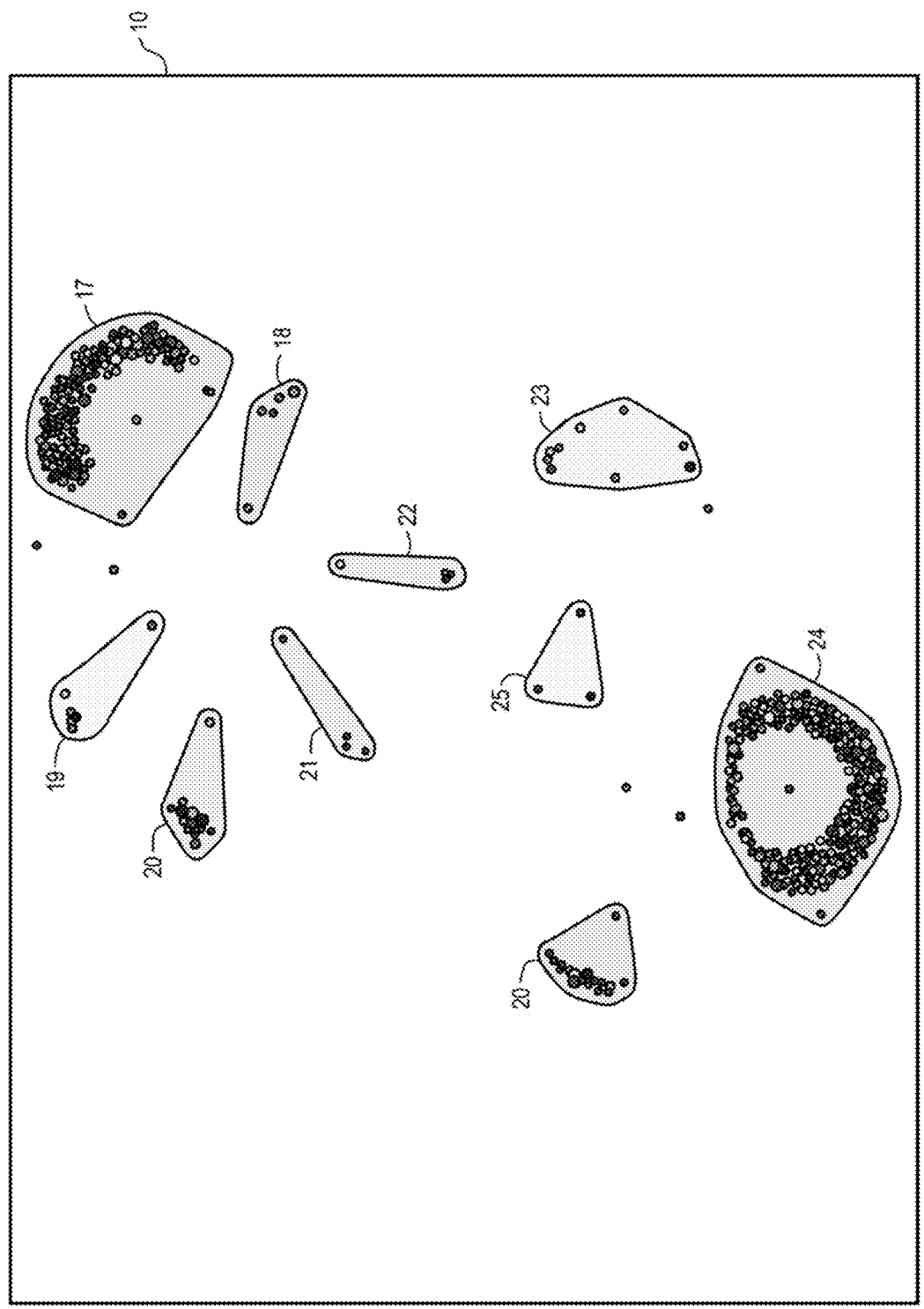
FIG. 4 is a fourth visualization in an example sequence of visualizations that show how beacons and clusters of beacons animate into a stable position.

Continuing with the animated sequence, FIG. 4 shows a fourth visualization of the example sequence rendered in window 10. At this point, nearly all of the nodes have coalesced into distinct clusters 17-26. Note that the clusters 17 and 24 each contain a relatively large number of beacons, with the two clusters being separated by a relatively large distance across the display screen. Each of the clusters in FIG. 4 is shown including a convex hull or convex envelope consisting of a set of straight and curved connected lines that surround all of the nodes or beacons located in an interior region. The interior regions are shown shaded to denote a mean or average dimension associated with each cluster. In one embodiment, the interior regions are colored in the same manner as the individual beacons (i.e., from dark green→ dark red) in correspondence with the mean webpage load time of that cluster.

Persons of skill will appreciate that even though clusters 17-26 are reasonably segregated, without the addition of the convex hulls it may be difficult to tell where one cluster ends and another cluster starts. In other words, the addition of the convex hulls makes the visualization clearer.

The convex hulls may be drawn using a variety of methods. In one embodiment, each convex hull is drawn around all points in the cluster using a method described in an article found at https://en.wikipedia.org/wiki/Convex_hull. In a specific embodiment the hull's transparency is set to a value of 0.6, and the corners are rounded to make it appear smooth, which helps with clarity in the event that adjacent clusters overlap. As discussed above, the interior of the hull is colored based on the median load time of all beacons contained in the cluster. In one embodiment, convex hulls are only drawn around clusters that have more than 0.12% of all nodes displayed in window 10. This enhances the appearance of the largest clusters.

Figure 5:
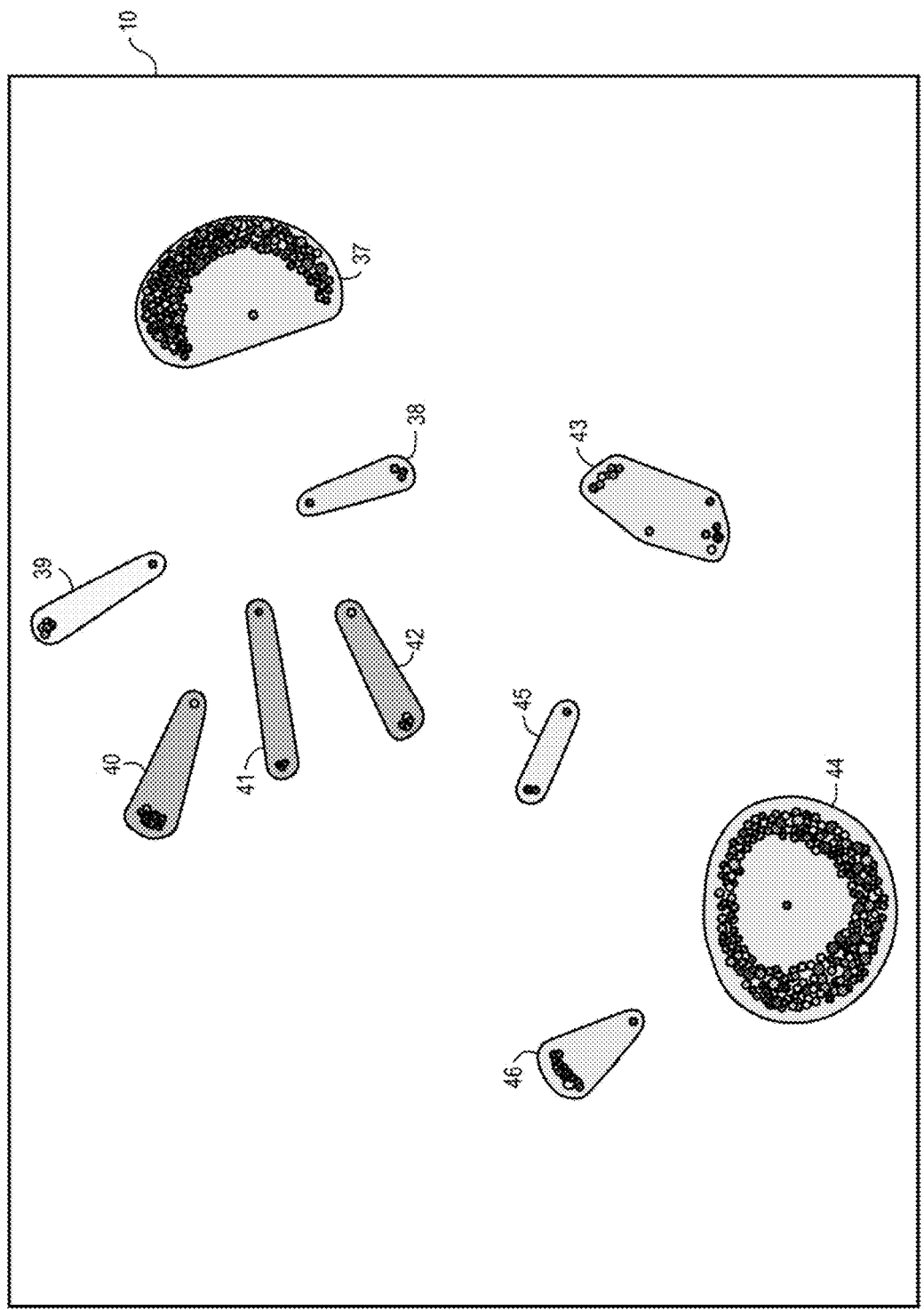
FIG. 5 is a fifth visualization in an example sequence of visualizations that show how beacons and clusters of beacons animate into a stable position.

FIG. 5 is a fifth visualization in an example sequence of visualizations that shows how clusters 17-26 from FIG. 4 have moved to new positions in window 10. The distinctive clusters 37-46 shown in FIG. 5 appear in new positions relative to one another. Note also that the beacons in each cluster have also moved to new positions within the cluster, and the shape of each convex hull has changed (smoothed) in response to the movement of the beacons. Within each cluster, the representative node is easily discerned as a single node separated by a considerable distance from all the other nodes or beacons of that cluster. For instance, the representative node in cluster 44 is shown substantially located near the center of the group of beacons which surround it in a ring-shape.

Figure 6:
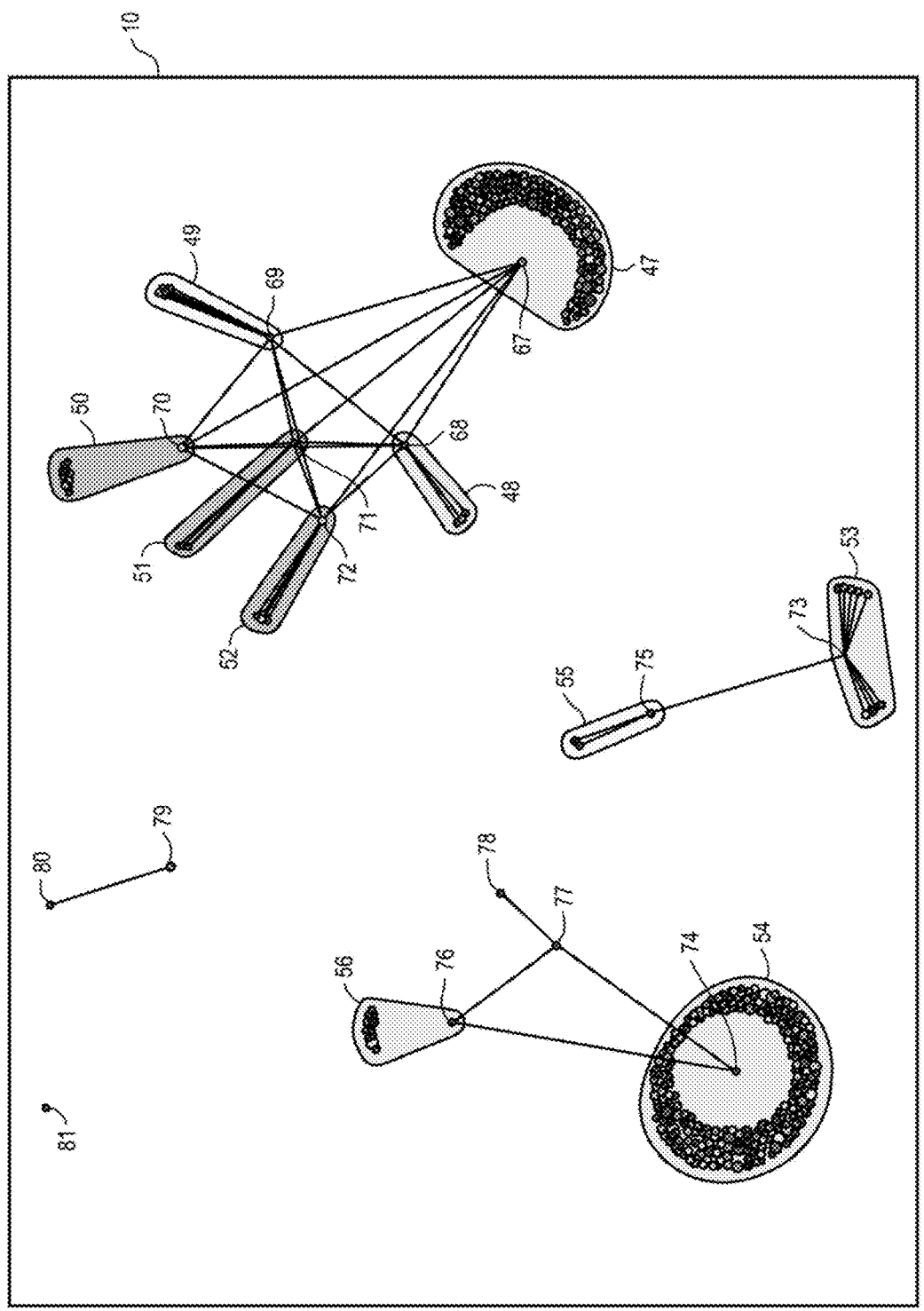
FIG. 6 is a sixth visualization in an example sequence of visualizations that show how beacons and clusters of beacons animate into a stable position.

FIG. 6 is a sixth and final visualization in an example animated sequence of visualizations. At this point, the visualization has achieved an equilibrium or stable state such that all of the clusters and beacons have a fixed position. Within window 10 are shown clusters 47-56, each of which includes a corresponding representative node 67-76, respectively.

Although not shown in FIG. 6, having achieved a stable state, in one embodiment descriptive labels may be rendered adjacent each cluster using a separate force directed graph. In another embodiment, the labels may appear in response to a mouseover event. In still another embodiment, labels for the clusters are automatically rendered once the visualization has achieved a substantially stable state, with a descriptive label of an individual beacon appearing in response to a mouseover event. In one embodiment, labels are not rendered for all groups. The smallest clusters, even those with hulls, may not have a label, so as to avoid crowding the space with unimportant labels.

The example of FIG. 6 also shows rendering of a plurality of lines or links connecting nodes that have a relatively high level of connectedness. Thus, each of representative nodes 67-72 are shown having links connected to all of the other nodes in that collection of related nodes. Also, representative nodes 73 and 75 are shown connected by a link. Representative nodes 74 and 76 are shown connected by a link. Both of nodes 74 and 76 are also each connected by a link with node 77, which, in turn, has a link to node 78. In addition, nodes 79 and 80 are linked to each other. As shown, beacon or node 81 is not closely related to any other node in the visualization. In one embodiment, links are rendered semi-transparent so anything under a link remains visible.

As discussed above, to avoid having too much activity early on while beacons are in a more chaotic state, rendering of the hulls, labels and label links is delayed until the visualization is in a more stable state. For instance, in one embodiment labels and links are drawn when the state activity drops below a predetermined activity threshold, wherein clusters do not move much relative to each other. Label positions may be calculated throughout the animated sequence of visualizations, but they are only made visible when the visualization is close to an equilibrium state.

Figure 7:
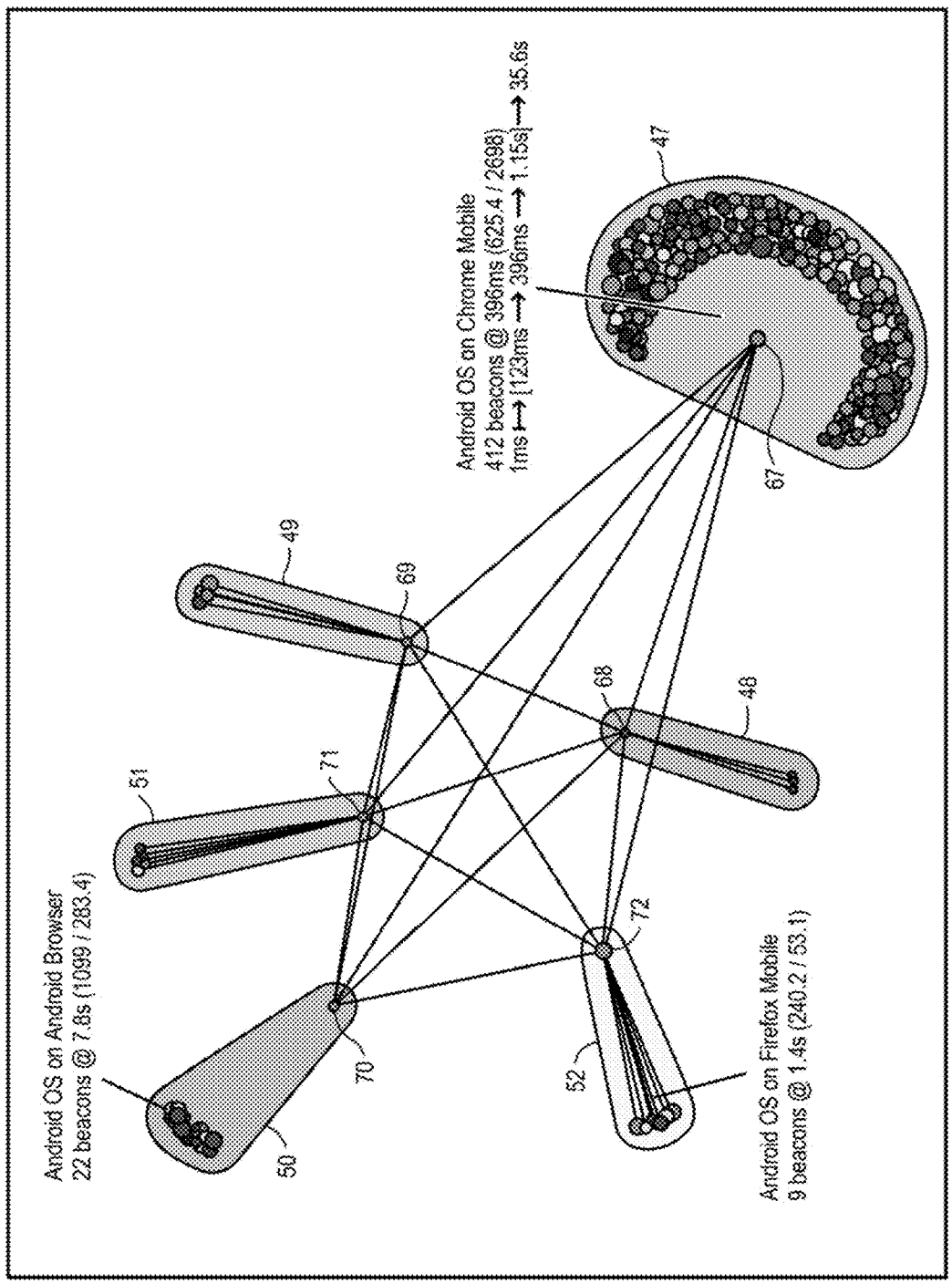
FIGS. 7-11 show zoomed in details of various beacon clusters illustrated in FIG. 6.

FIGS. 7-11 show zoomed in details of various beacon clusters illustrated in FIG. 6. For instance, FIG. 7 shows an expanded or zoomed view of a small supercluster consisting of related clusters 47-52. Note that descriptive labels are rendered adjacent clusters 47, 50 and 52. The labels for these three clusters indicate that each of beacons in these clusters were obtained from devices running Android OS, with cluster 47 running Android OS on Chrome Mobile, cluster 50 running Android OS on Android Browser, and cluster 52 running Android OS on Firefox Mobile.

Each of the labels shown in FIG. 7 lists the group name basic beacon information, e.g., count and median. Because cluster 47 is relatively large, the label also includes a third line that contains beacon spread (min., q1, median, q3, max.) rendered as a sort of textual box & whiskers plot. In one embodiment, the label font size may be adjusted based on group size such that smaller clusters use smaller fonts and larger groups use larger fonts.

Figure 8:
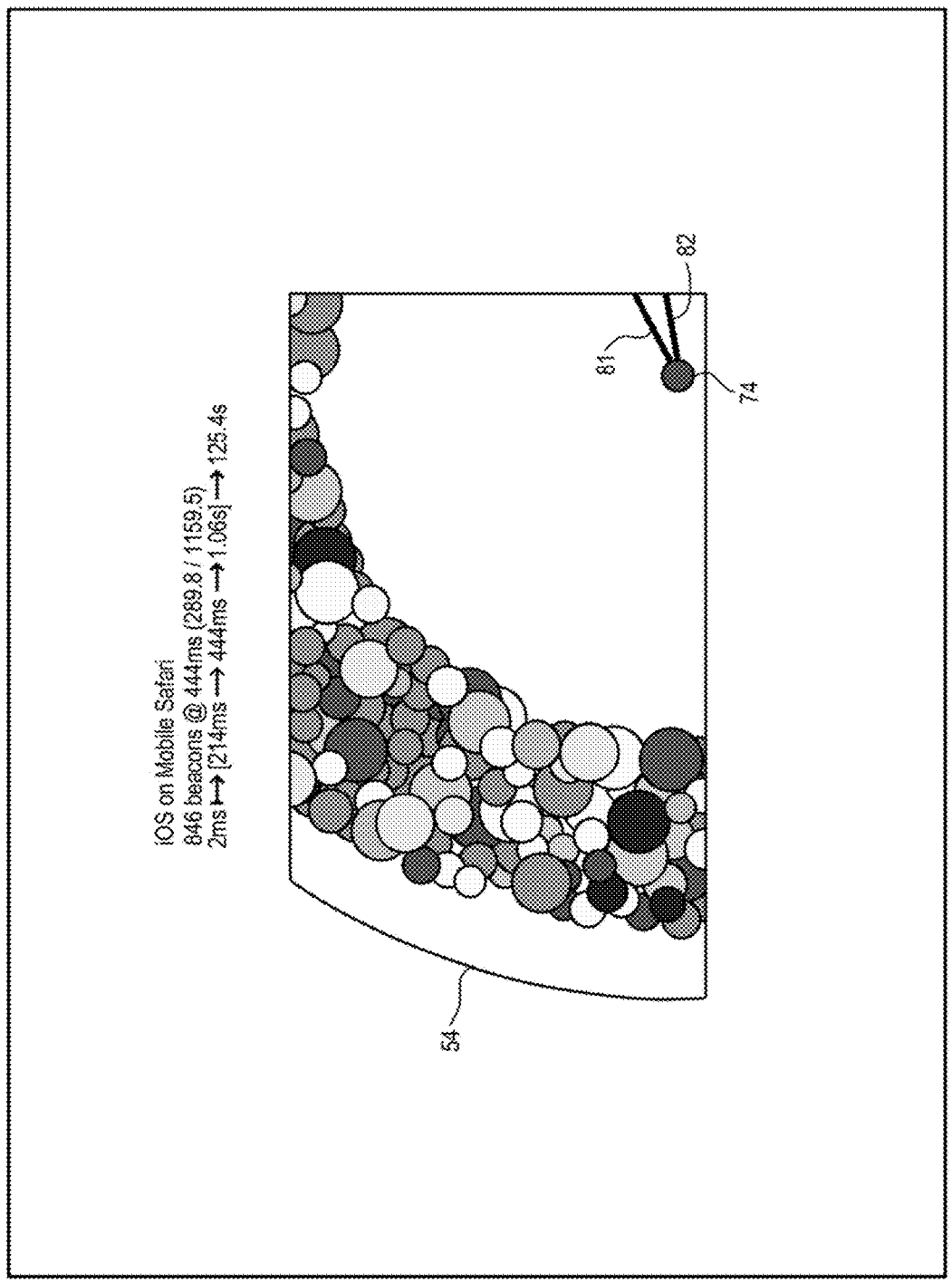

FIG. 8 shows a partial expanded view of cluster 54 showing representative node 74 separated from a ring containing a large plurality of nodes. Links 81 and 82 are shown connected to node 74. The label indicates that cluster 54 is running iOS on Mobile Safari, containing 846 beacons. FIG. 8 shows how a label overlapping other content remains legible.

Figure 9:
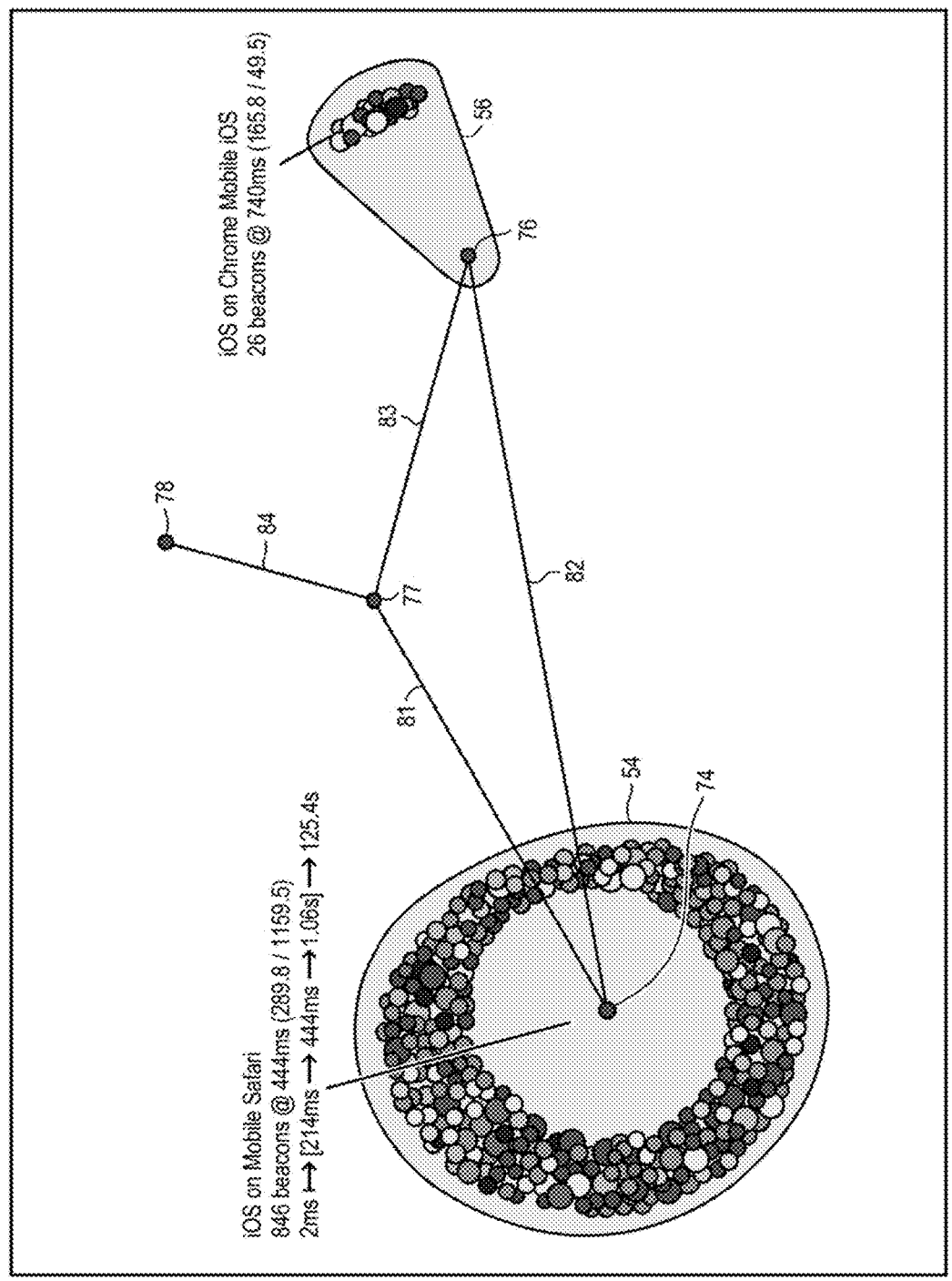

FIG. 9 shows how a large cluster 54 has three lines of detail listing key cluster properties, the beacon count, median beacon load time, and a summary of the load time range across beacons in the cluster. Smaller, but related, cluster 56 has only two lines of detail to reduce clutter.

Figure 10:
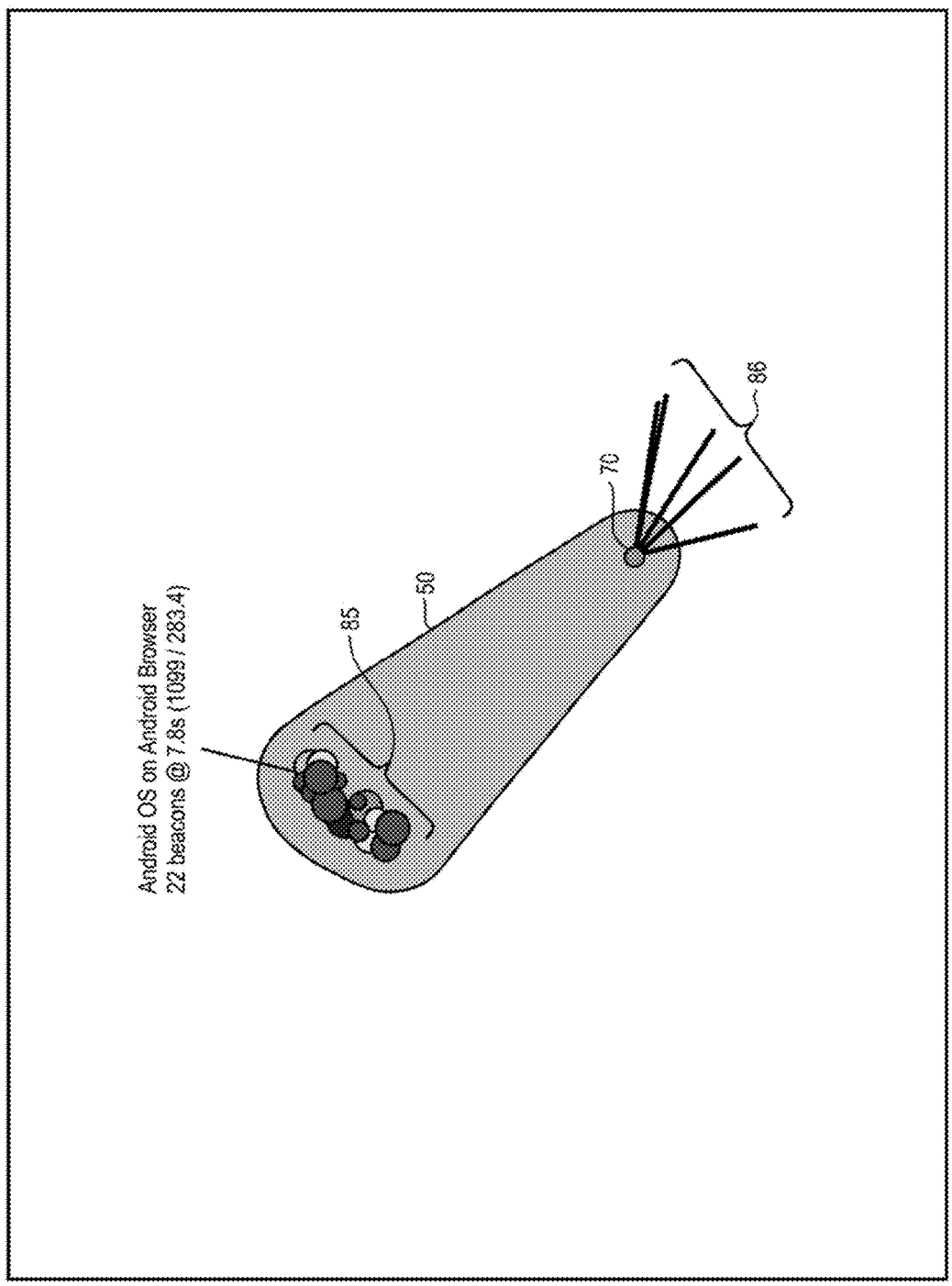
Figure 11:
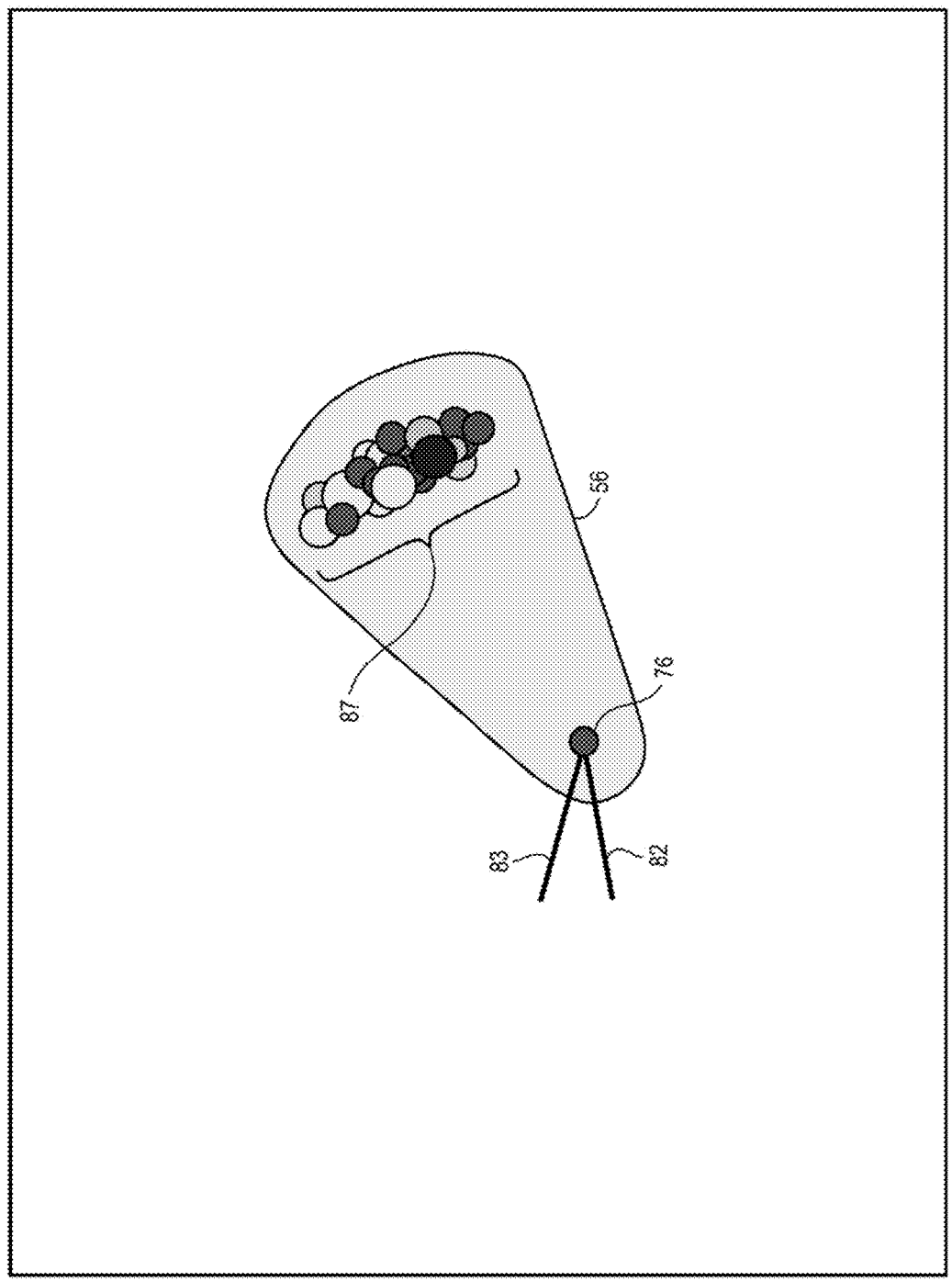

FIG. 10 shows how labels are positioned near the cluster (e.g., cluster 50) they describe with the connector links 86 being placed behind all important content, and angled from the nearest edge of the label. FIG. 11 shows how beacons 87 that are shaded or colored similar to the hull of cluster 56 are outlined in black. Note that representative node 76 is connected with links 82 & 83.

As discussed previously, each beacon within a cluster is colored based on its load time, and sized based on the DOM size of the page or page group they represent. The cluster hull is colored based on the median load time of all beacons within the cluster. If a beacon within the cluster has a color too similar to the hull color, then that beacon includes a translucent black border to clarify its position. Text labels are placed above all clusters, and all text has a translucent outline to make the text more legible when it overlaps other content. All lines that connect two clusters or labels to clusters are placed below the hull, the text and beacons so that the most important information is in the foreground. The line that joins labels to their clusters is positioned on one end at the weighted center of beacons in the cluster, while the other end is positioned within the label near the text edge or corner closest to the cluster it is related to. Labels repel each other to ensure they do not overlap. In one embodiment, label force directed graph has a high charge (−1000) for all nodes that forces them as far away from each other as possible while keeping all fixed nodes fixed to group centers.

FIG. 12 is an example graphical user interface window that shows cluster details, including a cluster description. In one embodiment, the example window shown in FIG. 12 may be produced on a display screen in response to a mouseover event wherein a user positions the cursor or other pointer directly over a particular cell or cluster. As shown, a text description summarizing the cluster is generated for display in a pop-up window. In this example, the cell or cluster has a name "PLP on iOS" (PLP may be a customer defined webpage name, e.g., Product Page.) This particular cell includes 69 beacons with a mean load time of 4.8 s. A breakdown of various other dimensions associated with the beacons (e.g., geographic location, the load time range including minimum, low watermark, $25^{th}$ percentile, median, 75th percentile, high watermark and maximum) and the variation within the cluster of other non-key dimensions is also included in this example. In one embodiment, the type and details of the cell that is displayed responsive to a mouseover event is configurable by the customer.

FIG. 13 is an example graphical user interface window that shows beacon details which may be produced in response to a mouseover event for a single beacon, representing one page view. As shown, the details of the beacon include the page construction (number of bytes, scripts, images, etc.), geo location, ISP and browser details.

Figure 16:
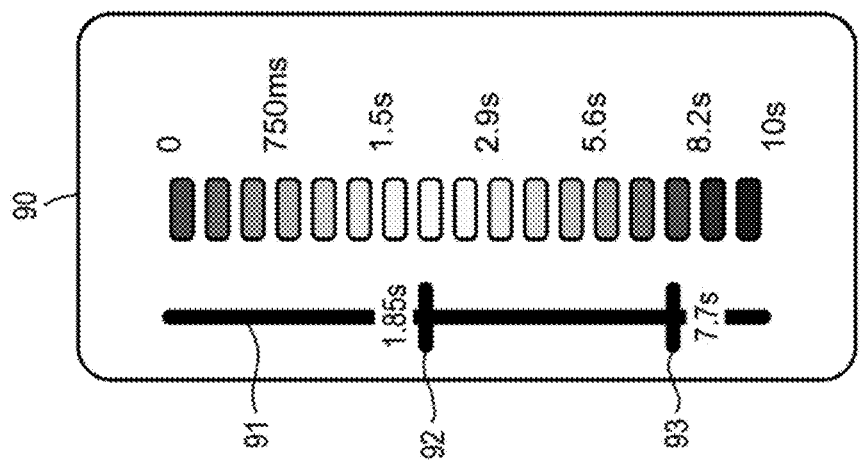
FIGS. 14-16 are example slider elements that illustrate the visualization's filtering capabilities.
Figure 15:
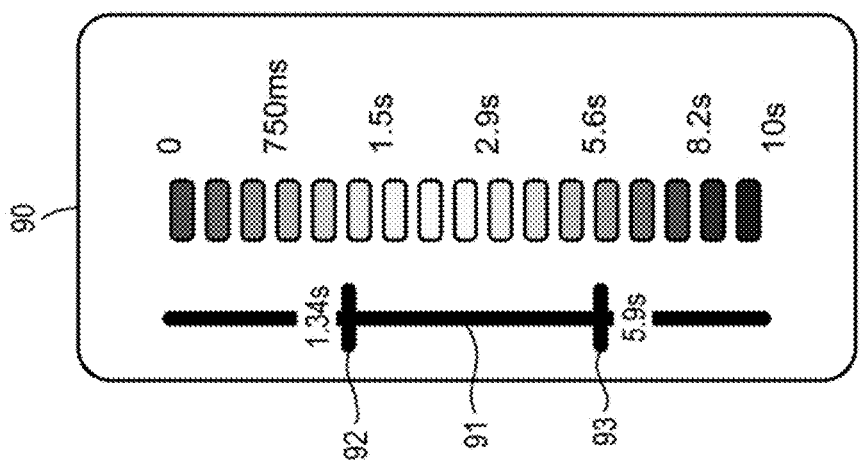
Figure 14:
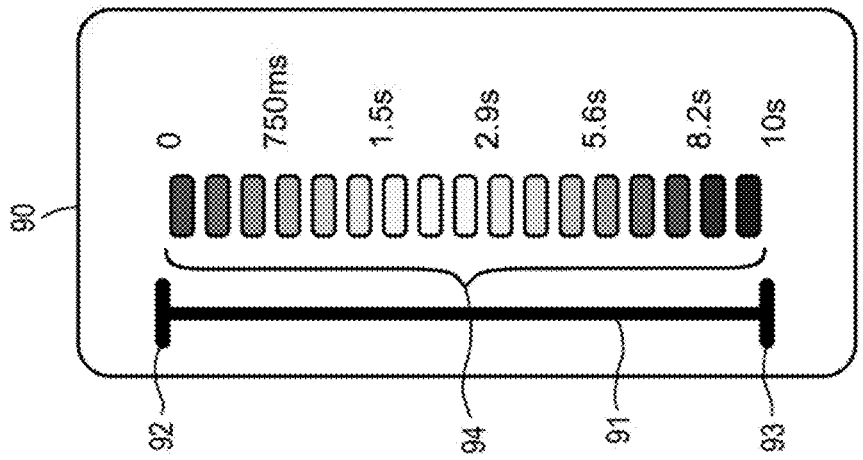

FIGS. 14-16 are example slider elements that illustrate the visualization's filtering capabilities. FIG. 14 shows a graphical user interface window or widget 90 that allows a user to filter the visualization based on a particular dimension, e.g., load time. Widget 90 includes a vertical slider bar 91 with brushes 92 & 93, each having a vertical position that corresponds to a value defined by shaded or color-coded key 94. As can be seen, key 94 has 17 bars, which, in one embodiment are color-coded in a spectrum ranging from dark green at the top (0 ms) to dark red at the bottom (10 s). In this example embodiment, a user may select or click-and-drag slider 92 or 93 to change its position on bar 91, thus changing the desired filtering range of the load time dimension appearing in the visualization. As shown, FIG. 14 is set to display a full range from 0 milliseconds to 10 seconds.

In the example of FIG. 15 a user has moved sliders 92 & 93 to positions denoting a filtering range from 1.34 to 5.9 seconds. In one embodiment, a user may click on bar 91 in a position between sliders 92 & 93 to move both sliders simultaneously up or down, while maintaining the spread or extent of the filtered range. This is illustrated in FIG. 16 where sliders 92 & 93 have been moved to new desired positions 1.85 s and 7.7 s, respectively, with a single click-and-drag operation. Note that the spread between the top and bottom of the load time range is 4.56 seconds in both of FIGS. 15 & 16.

Figure 17:
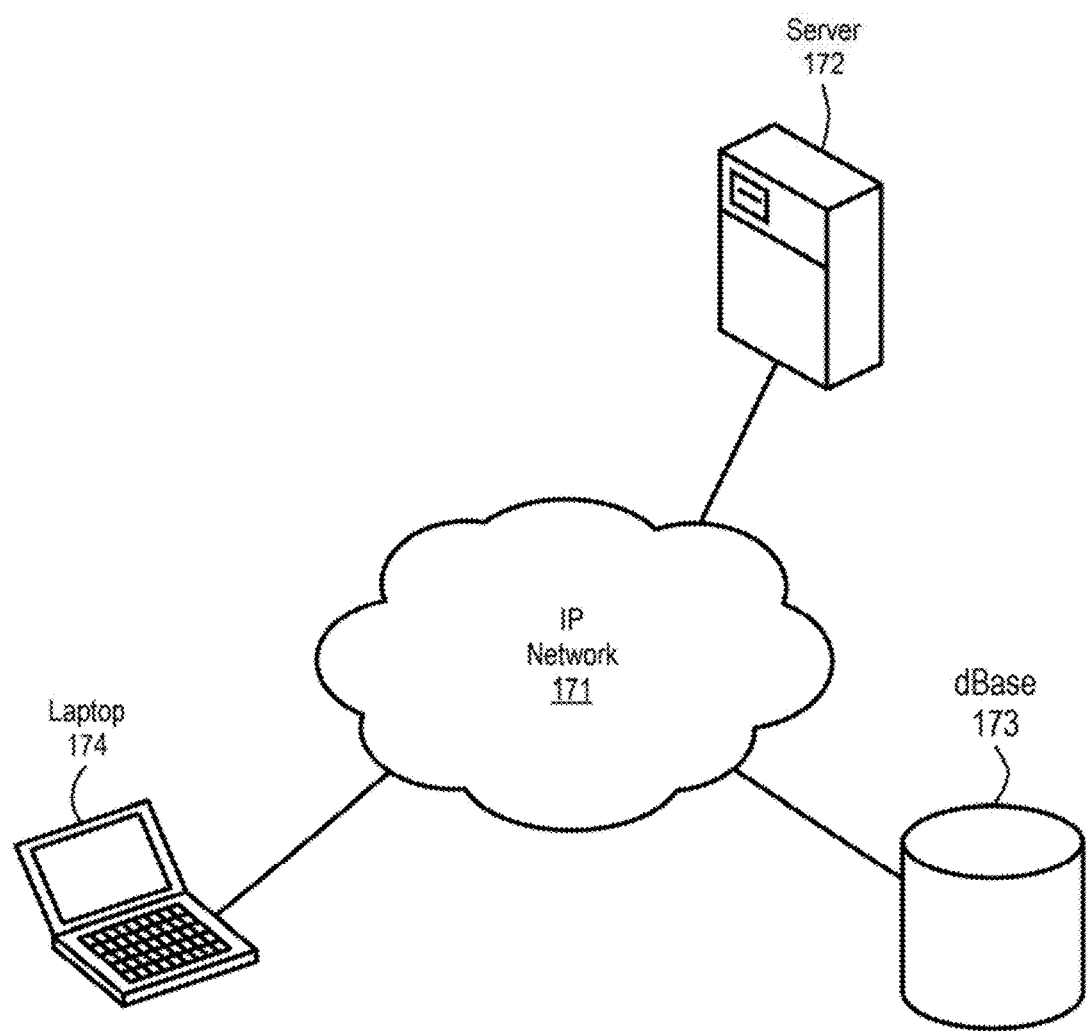
FIG. 17 is an example architectural diagram of a system for automatically generating the visualizations.

FIG. 17 is an example high level architectural diagram of a system for automatically generating visualizations in accordance with the embodiments described above. As shown, the system includes a server 172 connected via a cloud 171 with a laptop computer 174 and a database 1733. Cloud 171 may comprise an Internet Protocol (IP) network, such as the general public Internet, or an intranet private computer network confined to an organization that uses IP technology or a combination of private and public networks. Laptop computer 174 may alternatively comprise one or more computing devices, including mobile devices, desktop computers, or any other computing device that is configured to accept user input, communicate with server 172, and display the animated visualization results on a display screen. Server 172 shown in FIG. 17 may comprise a single server (as shown) or a plurality of servers, either located at a single center or distributed across different geographical locations.

Persons of skill in the art will understand that the software which generates the visualizations may also be downloaded to the user's computer or implemented on a separate hardware appliance unit located either at the user's premises (e.g., behind the firewall) or anywhere in the cloud.

In the embodiment shown, the algorithms for generating the visualizations described above comprise a computer program that executes on server 172 for automatically generating the animated visualized sequence for display on the client-side device (e.g., laptop 174). In other embodiments, the computer program may be downloaded to execute on laptop 174. Database 173 may comprise any memory or storage device that may be accessed by server 172 and/or laptop 174.

Server 172 communicates with laptop 174 via a browser application running on laptop 174. In one implementation, the computer program running on server 172 operates to create a graphical user interface (GUI) that allows a user of laptop 174 to remotely interact with the visualization program. In this way, a user of laptop computer 174 may enter input parameters (e.g., date/time range for the beacons stored in dBase 173) needed for creating the visualization in a matter of seconds (e.g., 10-30 seconds). The resulting animated visualization created by the program may be displayed on the display screen of laptop 174.

Figure 18:
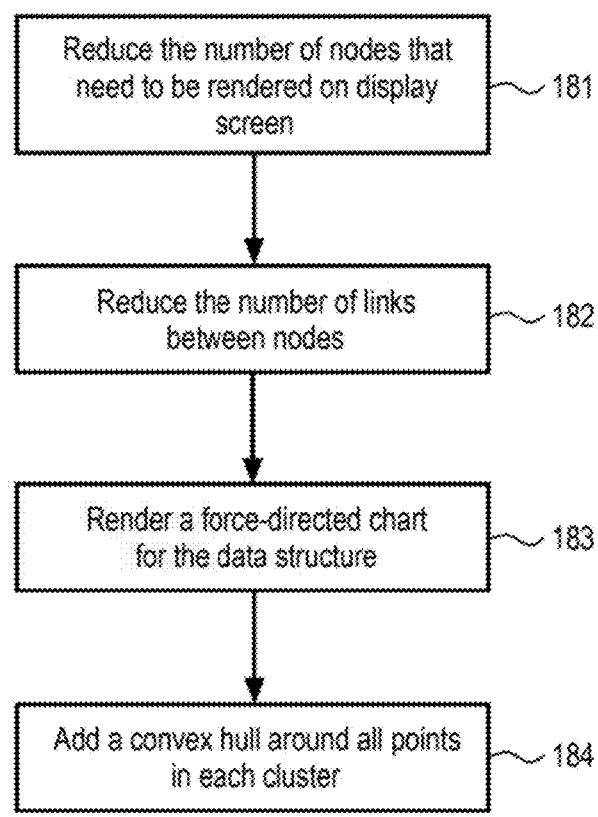
FIG. 18 is an example flow diagram of a process for creating the visualization sequence shown in FIGS. 1-6.

FIG. 18 is an example flow diagram of a process for creating the visualization sequence shown in FIGS. 1-6. The process begins with reducing the number of nodes or beacons that are to be rendered on the customer's display screen. (Block 181) Next, the number of links between nodes is reduced. (Block 182) Note that in other embodiments, the reduction of the number of links step may take place simultaneous with, or before, the step of reducing the number of nodes.

As discussed above, reducing the number of nodes that are actually rendered on the display screen provides significant performance advantages. This takes advantage of the fact that humans cannot visually tell the difference between large numbers of closely packed objects even if they differ in magnitude. Reducing the number of links between nodes, which reduces the number of nodes that interact with each other, also provides a big performance improvement. Together, reducing the number of nodes and links significantly reduces the value of n in the $O(n^2)$ algorithm. Even for visualizations with millions of datapoints, the resulting visualization might have only a few tens of clusters, which reduces $n^2$ by 10 orders of magnitude.

The next step in the process of FIG. 18 is the rendering of a force-directed chart for the data structure produced following the reduction of nodes and links. (Block 183) In one embodiment this involves assigning force units to each of the nodes and links, and then iteratively applying three laws of physics: Newton's law of gravitational attraction that pulls all nodes toward the center of the display screen; Coulomb's inverse-square law for the forces that push apart similarly charged particles; and Hooke's law of elasticity for the force required to pull apart particles linked by an elastic band. After a number of iterations of applying these laws to the beacons and nodes, large numbers of web performance beacons may form into clusters which may be visualized for the client side display screen. Once the clusters have formed and are reasonably segregated, convex hulls may be formed around all of the nodes in the cluster. (Block 184)

Figure 19:
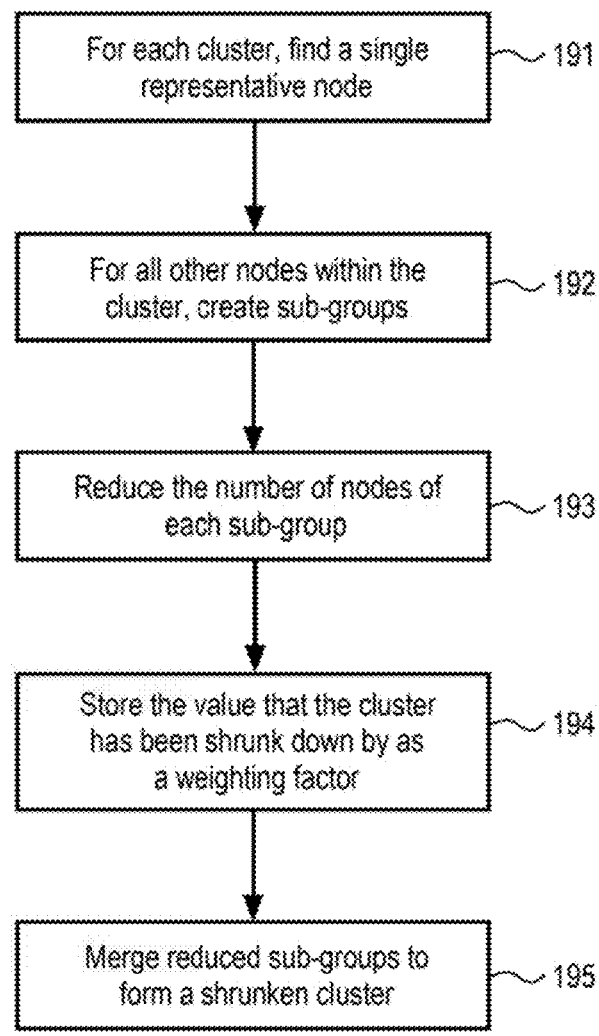
FIG. 19 is an example flow diagram of a method for reducing the number of nodes in the animated sequence.

FIG. 19 is an example flow diagram of a method for reducing the number of nodes in the animated sequence. In one embodiment, the following algorithm is utilized to reduce the number of nodes sent from the server to the client. First, for each cluster, a single representative node within the cluster is identified and marked as immutable. In one embodiment, a representative node is one that averages out or is close to the median of all other nodes within the cluster in terms of its numeric dimensions representing page load time, page size, and page complexity. (Block 191) For all the other nodes within the cluster, sub groups based on node similarity are created. (Block 192) For example, nodes with similar performance, complexity, geographic location, browser, etc., may be included in a sub-group of the cluster.

For each sub-group, the number of nodes is then reduced proportionately based on the size of the cluster as a whole. (Block 193) By way of example, for a cluster with 500,000 nodes and 5 sub-groups with 50,000, 80,000, 100,000, 120,000 and 150,000 nodes each, each sub-group is reduced by 95% to sub-groups of 2,500, 4,000, 5,000, 6,000 and 7,500, respectively, resulting in a cluster of 25,000 representative nodes. In the example of a smaller cluster with 50,000 nodes, the reduction may only be 75%, resulting in a cluster of 12,500 representative nodes.

Next, the value that each cluster has been reduced or shrunk by is stored in a memory or other data storage device. These values may be used as a weighting factor for how closely packed the cluster should be rendered in a subsequent method step. (Block 194) Finally, the reduced subgroups are merged back to form a shrunken cluster along with the shrinking factors associated with each sub-group. (Block 195) After all of the clusters have been shrunken, the reduced cluster list may be sent to the client.

Figure 20:
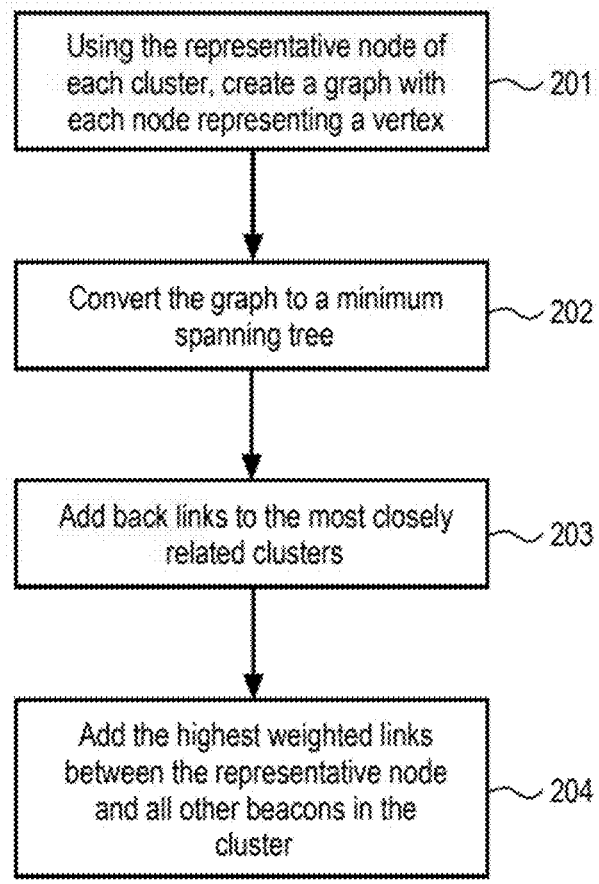
FIG. 20 is an example flow diagram of a method for reducing the number of links in the animated sequence.

FIG. 20 is an example flow diagram of a method for reducing the number of links in the animated sequence. The process may commence after the immutable representative node has been identified for each cluster. Using only the representative node of each cluster, a graph is created with each representative node representing a vertex, and the relatedness between nodes representing an undirected weighted edge or link. (Block 201) The graph is then converted to a minimum spanning tree which connects the least related nodes to each other. (Block 202) Persons of skill in the art will understand that a minimum spanning tree is a subset of the edges of a connected, edge-weighted undirected graph that connects all the vertices together, without any cycles and with the minimum possible total edge weight. In other words, it connects all the vertices together with the minimal total weighting for its edges.

In one embodiment, Kruskal's algorithm is used to create the minimum spanning tree. Kruskal's algorithm is a minimum-spanning-tree algorithm which finds an edge of the least possible weight that connects any two trees in the forest. In other embodiments, any one of a number of different suitable algorithms may be utilized to create the minimum spanning tree.

The next step in the process is the adding of back links to the most closely related clusters. (Block 203) In addition, the highest weighted links between the cluster representative and all other beacons in the cluster are added with a weighting factor based on the shrinking factor described above in connection with the reduction of nodes. (Block 204)

Figure 21:
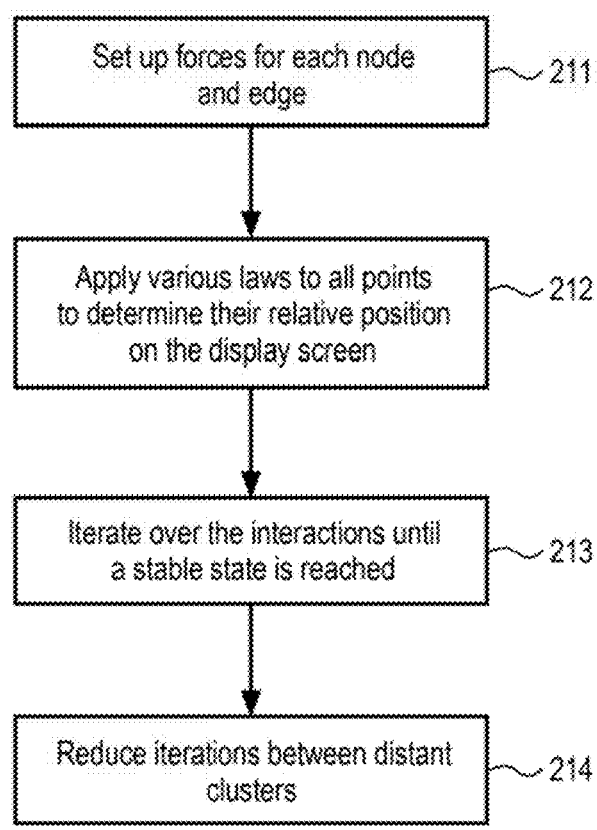
FIG. 21 is an example flow diagram of a method for rendering the data structures of the visualization sequence as a force-directed chart.

FIG. 21 is an example flow diagram of a method for rendering the data structures of the visualization sequence as a force-directed chart. The process shown in FIG. 21 begins with the step of setting up forces for each node and edge/link. (Block 211) In one embodiment, all cluster representative nodes are given a high negative charge of −850 units. All nodes within each cluster are assigned a negative charge between −10 to −40 units, based on their relative complexity. Link distance between unrelated clusters is set to 800 units. Link strength for related beacons is set to 1 unit. Link strength for unrelated beacons is set to 0.2 units. The center of the visualization is also given a very high gravitational mass.

Once the forces have been set for each node and edge or link, a set of physical laws are applied to all nodes and links to determine the relative position of the nodes and clusters on the display screen. (Block 212) In one embodiment, these laws include: (1) Newton's law of gravitational attraction that pulls all nodes towards the center; (2) Coulomb's inverse-square law for the forces that push apart similarly charged particles; in this case, the negatively charged nodes; and (3) Hooke's law of elasticity for the force required to pull apart particles linked by an elastic band or spring having a stiffness and length corresponding to the link strength and link distance, respectively.

In one embodiment, due to the complexity of calculating the forces between large numbers of points, the interactions are iterated using Verlet Integration until the forces and the movement of the clusters/beacons reaches a substantially stable state. (Block 213) In the example of FIG. 21, the interactions between distant clusters may be reduced using a suitable approximation algorithm. (Block 214) In one implementation, a Barnes-Hut simulation having order O(n log n), compared to a direct-sum algorithm which would be O($n^2$), is utilized.

It should be understood that elements of the disclosed subject matter may also be provided as a computer program product which may include a machine-readable medium having stored thereon instructions which may be used to program a computer (e.g., a processor or other electronic device) to perform a sequence of operations, such as those described above. Alternatively, the operations may be performed by a combination of hardware, firmware, and software. The machine-readable medium may include, but is not limited to, floppy diskettes, optical disks, CD-ROMs, and magneto-optical disks, ROMs, RAMs, EPROMs, EEPROMs, magnet or optical cards, or other type of machine-readable medium suitable for storing electronic instructions.

Additionally, although the present invention has been described in conjunction with specific embodiments, numerous modifications and alterations are well within the scope of the present invention. Accordingly, the specification and drawings are to be regarded in an illustrative rather than a restrictive sense.

I claim:

1. A computer-implemented method comprising:
providing a graphical user interface (GUI) that allows a user to create a sequence of visualizations on a display screen of real user measurement (RUM) data beacons collected from client devices over a specified time period from users interacting with a website, the RUM data beacons being rendered on the display screen as nodes grouped into a plurality of clusters in the sequence of visualizations, with relatedness between each beacon and each other beacon being represented as a visual link on the display screen, responsive to user input, the GUI:
reducing, by a server executing a program, a number of nodes rendered on the display screen;
reducing, by the server executing the program, a number of visual links between the nodes, each visual link connecting a pair of the nodes, the reduced number of nodes and the reduced number of visual links comprising a data structure;
iteratively rendering the data structure as a force-directed chart that moves the nodes into relative position on the display screen by:
(i) assigning force unit values to each of the nodes and visual links, each representative node of a cluster being assigned a relatively high negative charge and all remaining nodes in the cluster being assigned a relatively low negative charge, a link distance between unrelated clusters being set to a first unit value, and a link distance between related clusters being set to a second unit value substantially less than the first unit value, a link strength between the related clusters being set to a third unit value, and a link strength between the unrelated clusters being set to a fourth unit value substantially less than the third unit value; and
(ii) applying a plurality of laws to all of the nodes and links to determine their relative position in the sequence of visualizations rendered on the display screen based on assigned force unit values, the laws including a first law of attraction that simulates a gravitational force between all of the nodes and a center of the visualizations, a second law of repulsion that pushes apart similarly charged nodes, and a third law of elasticity that provides a connecting force between pairs of nodes that are linked, wherein the applying of the laws comprises iteratively calculating forces between all of the nodes until the forces reach a substantially stable state with each of the nodes and clusters being in a substantially stable position.

2. The computer-implemented method of claim 1 wherein the iterative calculations are performed using a Verlet Integration.

3. The computer-implemented method of claim 1 further comprising reducing interactions between clusters having a distant relationship using a Barnes-Hut simulation.

4. The computer-implemented method of claim 1 further comprising forming a convex hull around all the nodes in each cluster having more than a predetermined percentage of all of the nodes in the sequence of visualizations.

5. The computer-implemented method of claim 1 further comprising assigning a color to each node in the sequence of visualizations rendered on the display screen, the color being determined based on beacon performance of the node.

6. The computer-implemented method of claim 4 further comprising assigning a color to the convex hull of each cluster in the sequence of visualizations rendered on the display screen, the color being determined based on a median value of all of the nodes in the cluster.

7. The computer-implemented method of claim 1 wherein the reducing of the number of nodes rendered comprises:
   finding, by the server executing the program, a representative node for each cluster, the representative node having an average or median value with respect to dimensions that include at least one of page load time, page size, and page complexity;
   creating, by the server executing the program, sub-groups for all remaining nodes in each cluster based on node similarity;
   for each cluster, reducing, by the server executing the program, a number of nodes in each sub-group proportionately based on a size of the cluster; and
   storing in a memory associated with the server, as a weighting factor, a percentage value that each cluster has been reduced by.

8. The computer-implemented method of claim 1 wherein the first law of attraction simulates Newton's law of universal gravitation.

9. The computer-implemented method of claim 1 wherein the second law of repulsion simulates Coulomb's law.

10. The computer-implemented method of claim 1 wherein the third law of elasticity simulates Hooke's law.

11. The computer-implemented method of claim 7, wherein the reducing of the number of links comprises:
    creating, by the server executing the program, a graph using only the representative node of each cluster, with each representative node representing a vertex and relatedness between representative nodes representing an undirected weighted edge;
    converting, by the server executing the program, the graph to a minimum spanning tree which connects least related nodes to each other; and
    adding, by the server executing the program, highest weighted links between the representative node and all of the remaining nodes in each cluster based on the weighting factor of the cluster.

12. The computer-implemented method of claim 1 further comprising rendering in the sequence of visualizations a label associated with each cluster that exceeds a certain size, the label being positioned adjacent the cluster and including text that contains beacon information.

13. The computer-implemented method of claim 12 wherein the beacon information includes a beacon count and a median load time.

14. A non-transitory computer-readable storage medium encoded with computer instructions, which, when executed by one or more processors, operable to:
    provide a graphical user interface (GUI) that allows a user to create a sequence of visualizations on a display screen of real user measurement (RUM) data beacons collected from client devices over a specified time period from users interacting with a website, the RUM data beacons being rendered on the display screen as nodes grouped into a plurality of clusters in the sequence of visualizations, with relatedness between each beacon and each other beacon being represented as a visual link on the display screen, execution of the computer instructions being further operable to:
    reduce a number of nodes rendered on the display screen;
    reduce a number of visual links between the nodes, each visual link connecting a pair of the nodes, the reduced number of nodes and the reduced number of visual links comprising a data structure;
    iteratively render the data structure as a force-directed chart that moves the nodes into relative position on the display screen by assigning force unit values to each of the nodes and visual links, each representative node of a cluster being assigned a relatively high negative charge and all remaining nodes in the cluster being assigned a relatively low negative charge, a link distance between unrelated clusters being set to a first unit value, and a link distance between related clusters being set to a second unit value substantially less than the first unit value, a link strength between the related clusters being set to a third unit value, and a link strength between the unrelated clusters being set to a fourth unit value substantially less than the third unit value; and applying a plurality of laws to all of the nodes and links to determine their relative position in the sequence of visualizations rendered on the display screen based on their assigned force unit values, the laws including a first law of attraction that simulates a gravitational force between all of the nodes and a center of the visualizations, a second law of repulsion that pushes apart similarly charged nodes, and a third law of elasticity that provides a connecting force between pairs of nodes that are linked.

15. The non-transitory computer-readable storage medium of claim 14 wherein execution of the computer instructions is further operable to iteratively calculate forces between all of the nodes due to the application of the laws until the forces reach a substantially stable state with each of the nodes and clusters being in a substantially stable position.

16. The non-transitory computer-readable storage medium of claim 15 wherein the iterative calculations are performed using a Verlet Integration.

17. The non-transitory computer-readable storage medium of claim 14 wherein execution of the computer instructions is further operable to form a convex hull around all the nodes in each cluster having more than a predetermined percentage of all of the nodes in the sequence of visualizations.

18. The non-transitory computer-readable storage medium of claim 14 wherein execution of the computer instructions is further operable to assign a color to each node in the sequence of visualizations rendered on the display screen, the color being determined based on beacon performance of the node.

19. The non-transitory computer-readable storage medium of claim 17 wherein execution of the computer instructions is further operable to assign a color to the convex hull of each cluster in the sequence of visualizations rendered on the display screen, the color being determined based on a median value of all of the nodes in the cluster.

20. The non-transitory computer-readable storage medium of claim 14 wherein execution of the computer instructions is further operable to:
find a representative node for each cluster, the representative node having an average or median value with respect to dimensions that include at least one of page load time, page size, and page complexity;
create sub-groups for all remaining nodes in each cluster based on node similarity;
for each cluster, reduce a number of nodes in each sub-group proportionately based on a size of the cluster; and
store in a memory associated with the one or more processors, as a weighting factor, a percentage value that each cluster has been reduced by.

21. The non-transitory computer-readable storage medium of claim 14 wherein the first law of attraction simulates Newton's law of universal gravitation.

22. The non-transitory computer-readable storage medium of claim 14 wherein the second law of repulsion simulates Coulomb's law.

23. The non-transitory computer-readable storage medium of claim 14 wherein the third law of elasticity simulates Hooke's law.

24. The computer-implemented method of claim 20 wherein execution of the computer instructions is further operable to:
create a graph using only the representative node of each cluster, with each representative node representing a vertex and relatedness between representative nodes representing an undirected weighted edge;
convert the graph to a minimum spanning tree which connects least related nodes to each other; and
add highest weighted links between the representative node and all of the remaining nodes in each cluster based on the weighting factor of the cluster.

* * * * *